US009766553B2

(12) United States Patent
Maul

(10) Patent No.: US 9,766,553 B2
(45) Date of Patent: Sep. 19, 2017

(54) ILLUMINATION OPTICAL UNIT FOR PROJECTION LITHOGRAPHY

(71) Applicant: Carl Zeiss SMT GmbH, Oberkochen (DE)

(72) Inventor: Manfred Maul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 134 days.

(21) Appl. No.: 14/830,985

(22) Filed: Aug. 20, 2015

(65) Prior Publication Data
US 2015/0355555 A1    Dec. 10, 2015

Related U.S. Application Data

(63) Continuation of application No. PCT/EP2014/054422, filed on Mar. 7, 2014.
(Continued)

(30) Foreign Application Priority Data

Mar. 14, 2013  (DE) .................. 10 2013 204 431

(51) Int. Cl.
*G03F 7/20* (2006.01)
*G02B 5/09* (2006.01)
*G02B 27/09* (2006.01)

(52) U.S. Cl.
CPC ........... *G03F 7/70566* (2013.01); *G02B 5/09* (2013.01); *G02B 27/0905* (2013.01);
(Continued)

(58) Field of Classification Search
CPC .. G02B 27/0905; G02B 27/0983; G02B 5/09; G03F 7/70033; G03F 7/70075;
(Continued)

(56) References Cited

U.S. PATENT DOCUMENTS 6,195,201 B1    2/2001  Koch et al.
2002/0196391 A1*  12/2002  von Gutfeld ......... G02F 1/1339
                                                         349/86
(Continued)

FOREIGN PATENT DOCUMENTS

DE    102008002749 A1    12/2009
EP       1225481 A2       7/2002
(Continued)

OTHER PUBLICATIONS

International Search Report Corresponding to International Application No. PCT/EP2014/054422, dated Jul. 10, 2014.
(Continued)

*Primary Examiner* — Michelle M Iacoletti
(74) *Attorney, Agent, or Firm* — Fish & Richardson P.C.

(57) ABSTRACT

The disclosure provides an illumination optical unit for projection lithography, which illuminates an object field with illumination light. The illumination optical unit includes a field facet mirror with a plurality of field facets and a pupil facet mirror with a plurality of pupil facets. The field facets are imaged in the object field by a transfer optical unit. The pupil facet mirror includes a pupil facet mirror polarization section and a pupil facet mirror neutral section. The polarization section is arranged so that the illumination light is reflected in the region of a Brewster angle. The neutral section is arranged so that the illumination light is reflected in the region of a normal incidence.

18 Claims, 10 Drawing Sheets

Related U.S. Application Data

(60) Provisional application No. 61/781,179, filed on Mar. 14, 2013.

(52) U.S. Cl.
CPC ...... *G03F 7/70075* (2013.01); *G03F 7/70116* (2013.01); *G03F 7/70191* (2013.01); *G02B 27/0983* (2013.01)

(58) Field of Classification Search
CPC ............. G03F 7/70116; G03F 7/70191; G03F 7/70091; G03F 7/7015; G03F 7/70566
See application file for complete search history.

(56) References Cited

U.S. PATENT DOCUMENTS

| | | |
|---|---|---|
| 2011/0001947 A1 | 1/2011 | Dinger et al. |
| 2011/0122392 A1 | 5/2011 | Fiolka et al. |
| 2013/0021592 A1 | 1/2013 | Hempelmann et al. |

FOREIGN PATENT DOCUMENTS

| | | |
|---|---|---|
| WO | WO 2009/095052 A1 | 8/2009 |
| WO | WO 2009/100856 A1 | 8/2009 |
| WO | WO 2010/049076 A2 | 5/2010 |
| WO | WO 2013/013947 A2 | 1/2013 |

OTHER PUBLICATIONS

German Office Action, with translation thereof, for corresponding DE Appl No. 10 2013 204 431.3, dated Nov. 18, 2013.

* cited by examiner

ILLUMINATION OPTICAL UNIT FOR PROJECTION LITHOGRAPHY

CROSS-REFERENCE TO RELATED APPLICATIONS

The present application is a continuation of, and claims benefit under 35 USC 120 to, international application of PCT/EP2014/054422, filed Mar. 7, 2014, which claims benefit under 35 USC 119 of German Application No. 10 2013 204 431.3, filed Mar. 14, 2013. International application of PCT/EP2014/054422 also claims priority under 35 USC 119(e) to U.S. Provisional Application No. 61/781,179, filed Mar. 14, 2013. The contents of international application of PCT/EP2014/054422 and German patent application DE 10 2013 204 431.3 are incorporated by reference.

The invention relates to an illumination optical unit for projection lithography, for illuminating an object field, in which an object to be imaged can be arranged, with illumination light. Furthermore, the invention relates to an optical system and an illumination system with such an illumination optical unit, a projection exposure apparatus with such an illumination system, a production method for producing a microstructured or nanostructured component using such a projection exposure apparatus and a component produced thereby.

An illumination optical unit of the type set forth at the outset is known from WO 2010/049076 A2 and WO 2009/095052 A1. US 2011/0 001 947 A1 and U.S. Pat. No. 6,195,201 B1 each describe illumination optical units for projection lithography, for illuminating an object field with a field facet mirror and a pupil facet mirror. An illumination optical unit with an individual mirror array is known from WO 2009/100 856 A1.

It is an object of the present invention to configure in a flexible manner the illumination of the object to be imaged and to make it well-adaptable to predetermined values.

According to the invention, this object is achieved by an illumination optical unit for projection lithography, for illuminating an object field, in which an object to be imaged can be arranged, with illumination light. The illumination optical unit comprises a field facet mirror with a plurality of field facets, and at least one pupil facet mirror with a plurality of pupil facets, wherein the field facets are imaged into the object field by a transfer optical unit. At least one pupil facet mirror polarization section is arranged in such a way that angles of incidence of an illumination beam path of the illumination light along illumination channels, which are respectively formed by one of the field facets and by one of the pupil facets, which are aligned for guiding a partial beam of the illumination light, deviate at the pupil facets of the pupil facet mirror polarization section by at most 20° from a Brewster angle of a multilayer reflection coating on the pupil facets of the pupil facet mirror polarization section. At least one pupil facet mirror neutral section is arranged in such a way that angles of incidence of an illumination beam path of the illumination light along illumination channels, which are respectively formed by one of the field facets and by one of the pupil facets, which are aligned for guiding a partial beam of the illumination light, deviate at the pupil facets of the pupil facet mirror neutral section by at most 20° from a normal incidence on the pupil facets of the pupil facet mirror neutral section.

According to the invention, it was identified that a subdivision of the pupil facet mirror into at least one polarization section and at least one neutral section offers the option of alternatively illuminating the object field with at least partially polarized and/or unpolarized light. This polarized/unpolarized illumination can be selected according to the illumination requirements of, in particular, the reticle, but also of the optical components of the illumination optical unit. The polarization of the EUV illumination light can be preselected by selecting the respectively impinged upon pupil facet mirror section. For at least one of the pupil facet mirror sections, the deviation of angles of incidence from the Brewster angle and/or the normal incidence can be at most 15°, can be at most 10°, can be at most 5°, can be at most 4° and can be at most 3°. A dark field illumination of the object field via a central section of the pupil facet mirror is also possible.

The field facet mirror can embodied with field facets that can be tilted in such a way that, depending on the tilt position of the field facets, the pupil facet mirror polarization section and the pupil facet mirror neutral section can alternatively be impinged upon by the illumination light. The field facet mirror is embodied overall to be able to be tilted in such a way that, depending on the tilt position of the field facet mirror, the pupil facet mirror polarization section and the pupil facet mirror neutral section can alternatively be impinged upon by the illumination light. Such embodiments were found to be particularly suitable for alternative impingement of the various pupil facet mirror sections. In particular, a support of the field facet mirror can be embodied to be tiltable. Alternatively, or in addition thereto, the illumination optical unit can have a deflection facet mirror with deflection facets, which are tiltable for selecting the respective pupil facet mirror section and are arranged in the illumination beam path between the field facet mirror and the pupil facet mirror, for at least one of the pupil facet mirror sections. Alternatively, or in addition thereto, at least one further deflection mirror can be provided between the field facet mirror and the pupil facet mirror for guiding an illumination beam path for at least one of the pupil facet mirror sections.

A guiding of a central chief ray of the illumination beam path for the pupil facet mirror neutral section can lie outside of, at least in sections, a chief guiding plane of a central chief ray of the illumination beam path for the at least one pupil facet mirror polarization section, wherein the chief guiding plane is defined by a center of a reflection surface of the field facet mirror, a center of a reflection surface of the pupil facet mirror and a central object field point. By way of example, a deflection mirror, which is arranged at a distance from the chief guiding plane of the central chief ray of the illumination beam path for the pupil facet mirror polarization section, can bring about guidance of an illumination beam path guided, at least in sections, out of the chief guiding plane. It is possible to avoid obstructions by this guidance guided out of the chief guiding plane.

The pupil facet mirror polarization section and the pupil facet mirror neutral section can be sections of one and the same pupil facet mirror. At least one of the pupil facet mirror polarization sections can be arranged, at least in the form of a partial circle, around the pupil facet mirror neutral section. At least one of the pupil facet mirror neutral sections is arranged, at least in the form of a partial circle, around the pupil facet mirror polarization section. Such embodiments can have a compact configuration.

The pupil facet mirror polarization section or the pupil facet mirror neutral section can be displaced from the beam path of the illumination light between the field facet mirror and the object field. Such a pupil facet mirror section can clear the path, for example, for the illumination light to impinge upon a further pupil facet mirror section arranged there-behind in the illumination beam path. In part, changing between the impinged-upon pupil facet mirror sections and hence changing between polarizing and non-polarizing reflection on the pupil facet mirror is possible.

At least two pupil facet mirror polarization can be separate from one another. Such facet mirror sections can be displaced with respect to one another and/or with respect to the at least one pupil facet mirror neutral section.

A deflection facet mirror arranged between the field facet mirror and the pupil facet mirror can supply further degrees of freedom when designing the object field illumination. By way of example, specific target reflection angles can be achieved at the deflection facets or at the pupil facets. This can be employed for targeted employment of polarization effects during the reflection at the facets. The field facet mirror and/or the deflection facet mirror can be embodied as a multi-mirror array or micromirror array and can be embodied, in particular, as a microelectromechanical system (MEMS). Alternatively, the field facet mirror and/or the deflection facet mirror can have macroscopic field facets or deflection facets. To the extent that one of the facet mirrors is embodied as a micromirror array, respectively one of the facets can be formed by a group of micro individual mirrors or micromirrors. In the following text, such a group of micromirrors is also referred to as facet individual mirror group. Respectively one such field facet region from a group of the micro individual mirrors of the field facet mirror can illuminate one of the deflection facets or one of the pupil facets of the neutral section. In principle, respectively one of the deflection facets can also be formed by a group of micro individual mirrors. The deflection facets are oriented in such a way that they direct the illumination light from the direction of the respective field facet region, i.e. from the direction of a specific region of the field facet mirror, to exactly one of the pupil facets. The field facet region then is a field facet composed of a plurality or a multiplicity of micro individual mirrors. The deflection mirrors can be embodied as mirrors that can be tilted between different tilt positions, for example about two degrees of freedom. As a result of this, it is possible, for example, to assign a plurality of field facets and, in particular, of a plurality of groups of micro individual mirrors of the field facet mirror, optionally embodied as micromirror array, to exactly one of the pupil facets via appropriate guidance of the illumination light. The facets of the deflection facet mirror and/or the facets of the pupil facet mirror can also be embodied as rigid facets, i.e. as facets that cannot be tilted between different tilt positions. In the totality thereof, the pupil facets of the pupil facet mirror can be arranged in such a way that they can be reached by the field facets and/or deflection facets via small absolute changes in tilt angle. The pupil facets of the pupil facet mirror can be arranged in a hexagonal close packing arrangement, in a Cartesian arrangement, i.e. in rows and columns, or else in a rotationally symmetric manner. The arrangement of the pupil facets can be distorted, for example for correcting distortion effects. The deflection facet mirror and/or the pupil facet mirror can be an imaging component of the transfer optical unit and comprise e.g. concave and/or convex deflection facets or pupil facets. The deflection facets or the pupil facets can comprise elliptically or hyperbolically shaped reflection surfaces. Alternatively, the deflection facets or pupil facets can also be embodied as pure deflection mirrors. The transfer optical unit can be arranged after the pupil facet mirror. The field facet mirror can comprise several hundred field facets. The pupil facet mirror can comprise several thousand pupil facets. The number of deflection facets can equal the number of pupil facets. The number of the field facets can equal the number of pupil facets. The field facets and the micro individual mirrors possibly making these up can have curved or, alternatively, plane reflection surfaces for beam formation. The deflection facets of the deflection facet mirror can have curved or, alternatively, plane reflection surfaces for beam formation. The number of deflection facets can at least equal the number of pupil facets. The number of field facets or the number of micro individual mirrors of the field facet mirror, forming the field facets, can be much greater than the number of deflection facets and, for example, can be 10 times as great or even greater. The illumination optical unit can be configured in such a way that the deflection facet mirror is not imaged on the pupil facets. The illumination optical unit can be configured in such a way that the field facets are not imaged on the deflection facets. By being folded away, correction micromirrors of the field facet mirror and/or of the deflection facet mirror can be employed for correcting an intensity distribution and/or for correcting an illumination angle distribution over the object field or over an image field, in which the object field is imaged. Reflection surfaces of the field facets, the deflection facets and/or the pupil facets can be embodied as aspherical surfaces in order to correct aberrations of imaging in the object field. Using the illumination optical unit, it is possible to realize a polarization control of the illumination light.

It is possible to bring about an illumination and imaging geometry for projection lithography, in which object structures are imaged by, in particular, linearly polarized illumination light in such a way that diffraction planes predetermined by diffraction angles of the illumination light diffracted at the object structure include an angle with a polarization direction of the illumination light which it deviates by no more than 45°, by no more than 20°, by no more than 15°, by no more than 10° or even by no more than 5° from a normal of the respective diffraction plane. This can be employed for optimizing the imaging. The field facets of the field facet mirror can deviate from the form of the object field in order to compensate, at least in part, imaging effects when imaging the field facets in the object field. To this end, the field facet mirror can have a plurality of field facet form types, wherein the individual field facet form types differ from one another. The pupil facet mirror can be arranged in the region of the plane in which a light source of the illumination light is imaged. The field facets and/or the pupil facets in turn can be subdivided into plurality of individual mirrors. The pupil facet mirror can be a component of the illumination optical unit which ultimately guides the illumination light.

An optical system, can comprises an illumination optical unit described above and a projection optical unit for imaging the object field into an image field, in which a wafer to be exposed can be arranged. An illumination system can comprise an illumination optical unit described above and an EUV light source. A projection exposure apparatus can comprise an optical system described above and an EUV light source. A method for producing structured components, can comprise: providing a wafer, onto which a layer made of a light-sensitive material has been applied at least in part; providing a reticle, which has structures to be imaged; providing a projection exposure apparatus described above; and projecting at least part of the reticle onto a region of the layer of the wafer with the aid of the projection exposure apparatus. The advantages of such an optical system, such an illumination system, such a projection exposure apparatus, such a production method and a component produced by such a method correspond to those which were already explained above with reference to the illumination optical unit.

In particular, a projection optical unit of the optical system can be embodied with eight-fold reduction. This restricts an angle of incidence of the illumination light on an object that, in particular, has a reflecting embodiment. The transfer optical unit of the illumination system, in particular a beam-forming mirror described herein, can be configured in such a way that an exit pupil of the illumination optical unit lies more than 5 m in front of the object field in the illumination beam path. Alternatively, it is possible to achieve a position of the exit pupil of the illumination optical unit at infinity, i.e. a telecentric illumination optical unit, or a position of the exit pupil behind the object field in the illumination beam path, i.e. in the imaging beam path of the downstream projection optical unit.

The illumination optical unit of the projection exposure apparatus can be adapted to the light source in such a way that illumination light, which is optionally already pre-polarized in part by the light source, is guided in the illumination optical unit in such a way that linearly polarized illumination rays, produced, in particular, by the illumination optical unit, contain the largest possible portions of this pre-polarization. This optimizes a used-light yield of the projection exposure apparatus.

The projection exposure apparatus can have an object mount for mounting the object to be imaged in the object field. The object mount can have an object displacement drive for the controlled displacement of the object holder along an object displacement direction. The projection exposure apparatus can have a wafer mount for mounting the wafer in the image field. The wafer mount can have a displacement drive for controlled displacement of the wafer mount along the object displacement direction.

Exemplary embodiments of the invention will be explained in more detail below on the basis of the drawing. In the latter:

FIG. 1 very schematically shows a projection exposure apparatus for projection lithography, comprising an illumination optical unit and a projection optical unit, wherein an illumination and imaging light beam path is reproduced in a meridional section;

FIG. 2 shows a section through an illumination beam path of the illumination optical unit according to FIG. 1, in accordance with the line II-II in FIG. 1;

FIG. 3 schematically shows a top view of a pupil facet mirror, comprising a pupil facet mirror polarization section and a pupil facet mirror neutral section, and of a deflection facet mirror, which is arranged upstream of the pupil facet mirror in an illumination beam path, as components of the illumination optical unit of the projection exposure apparatus, as seen from the viewing direction III in FIG. 1;

FIGS. 4 and 5 each show a magnified section of the illumination optical unit according to FIG. 1 in the region of the pupil facet mirror and of the deflection facet mirror, wherein FIG. 4 shows illumination light or illumination radiation which is incident on the pupil facet mirror neutral section, and FIG. 5 instead shows the illumination radiation which is reflected by polarization sections of the pupil facet mirror;

Figure 1:
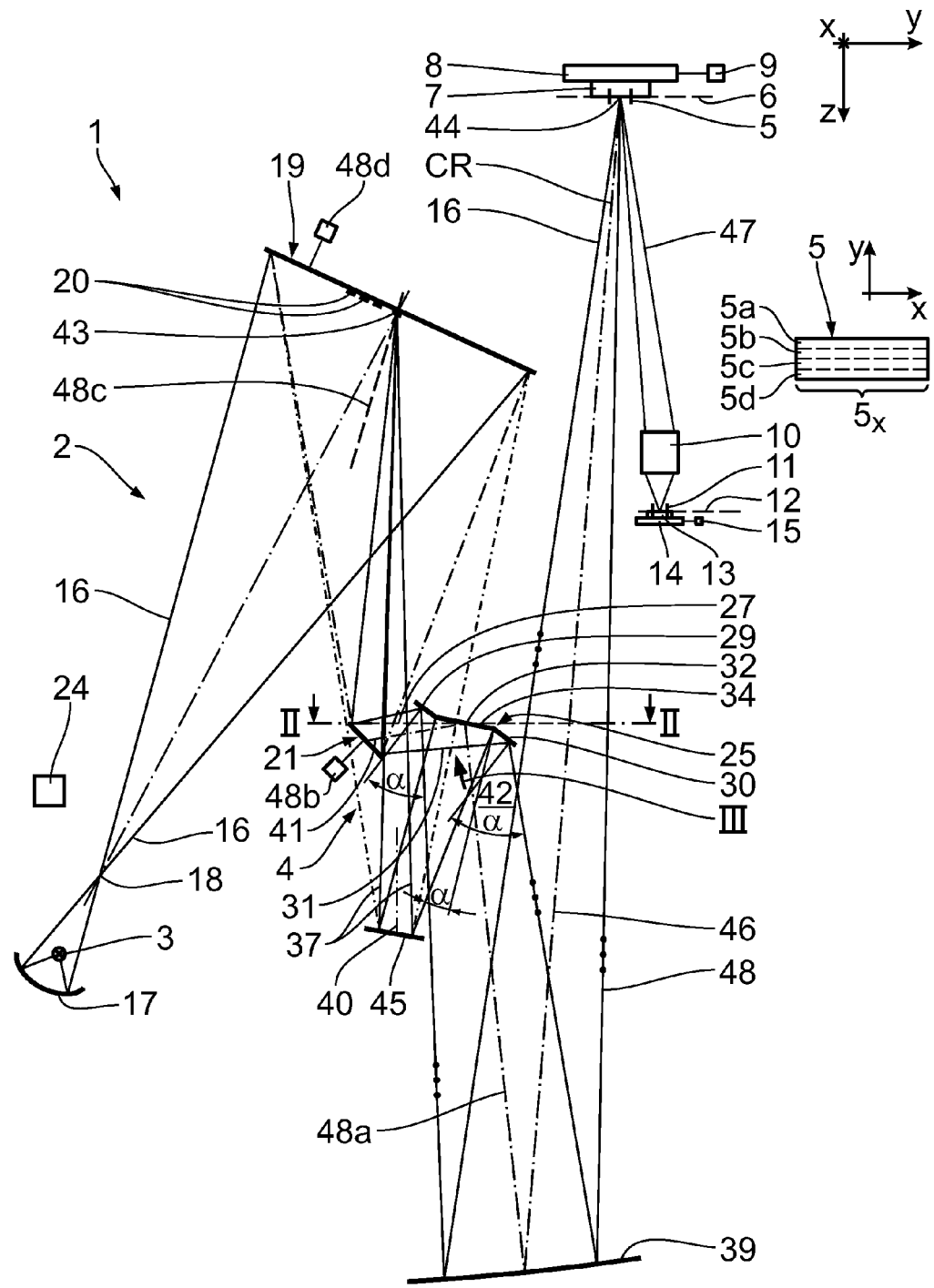
Figure 3:
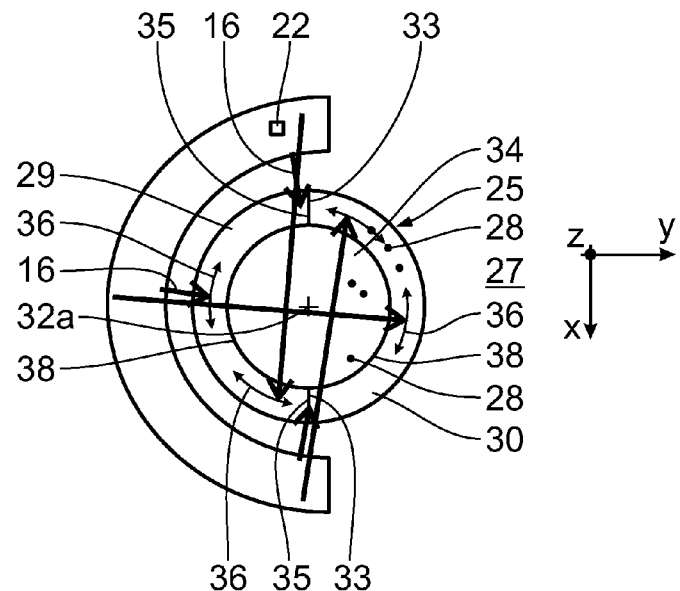
Figures 4, 5:
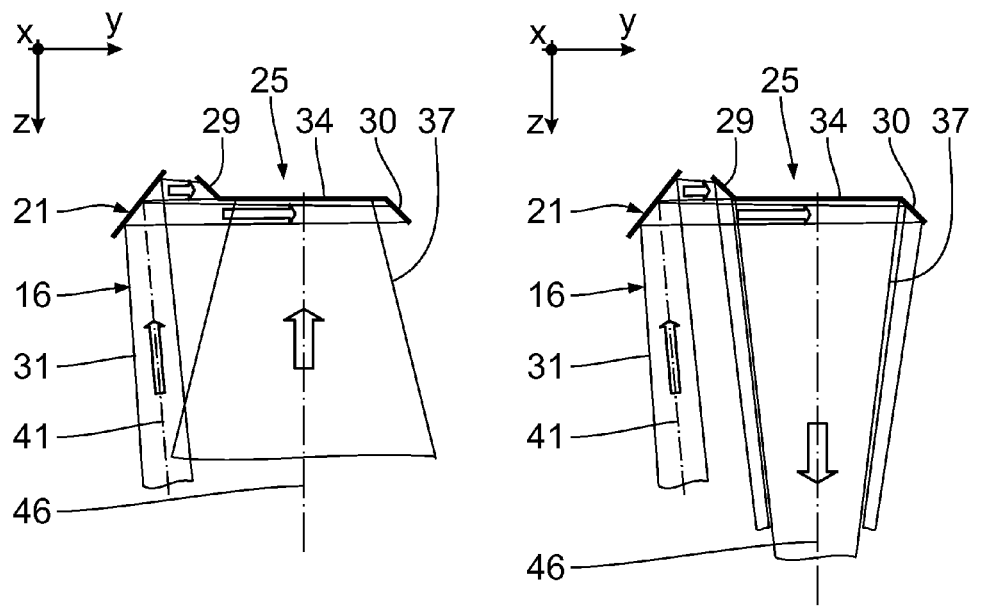
Figure 6:
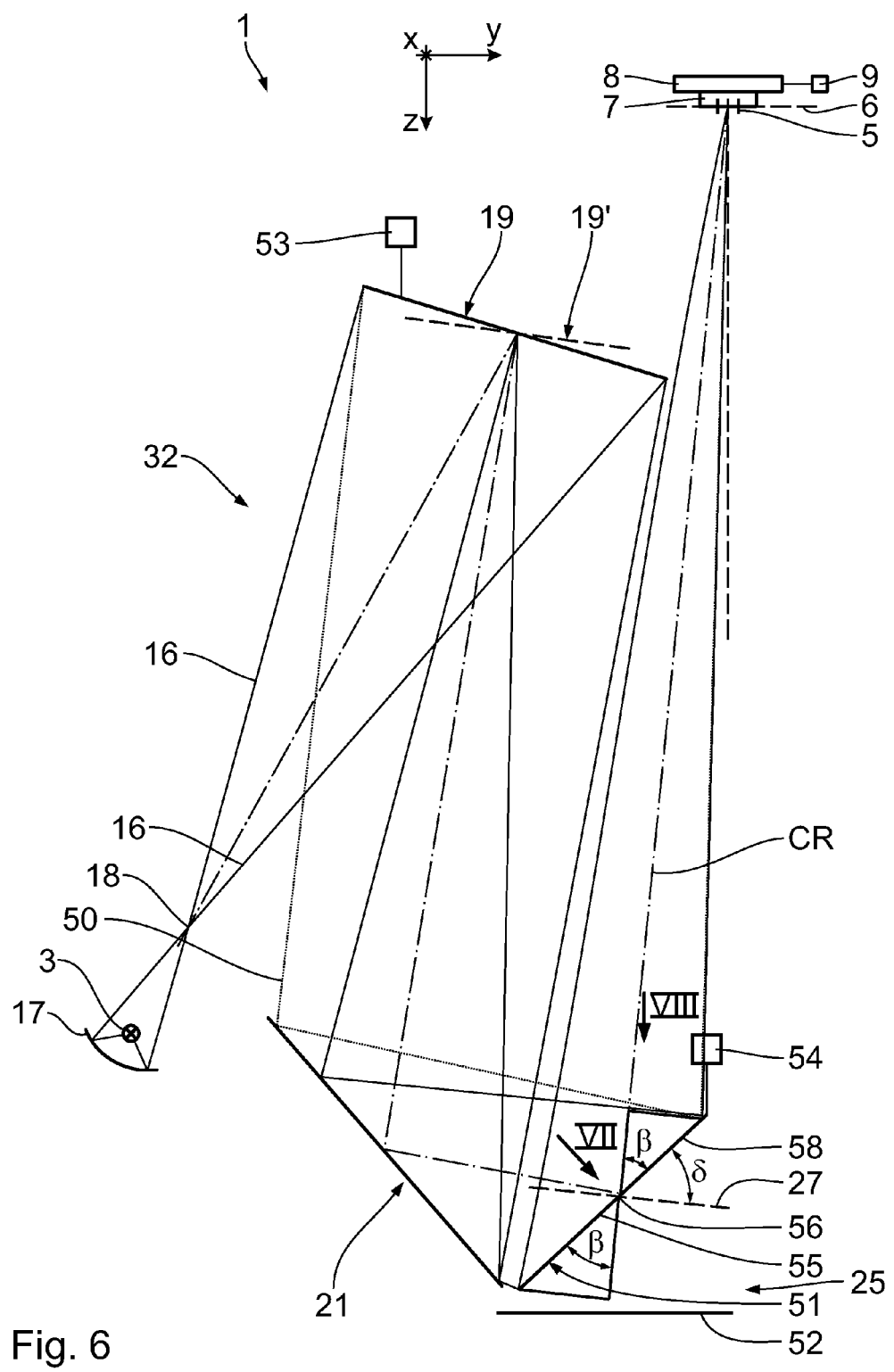
FIG. 6 shows a further embodiment of an illumination optical unit for the projection exposure apparatus, in a schematic illustration similar to FIG. 1, wherein an illumination beam path is depicted in FIG. 6 between an intermediate focus arranged downstream of a light source and an object or illumination field of the illumination optical unit.
Figure 9:
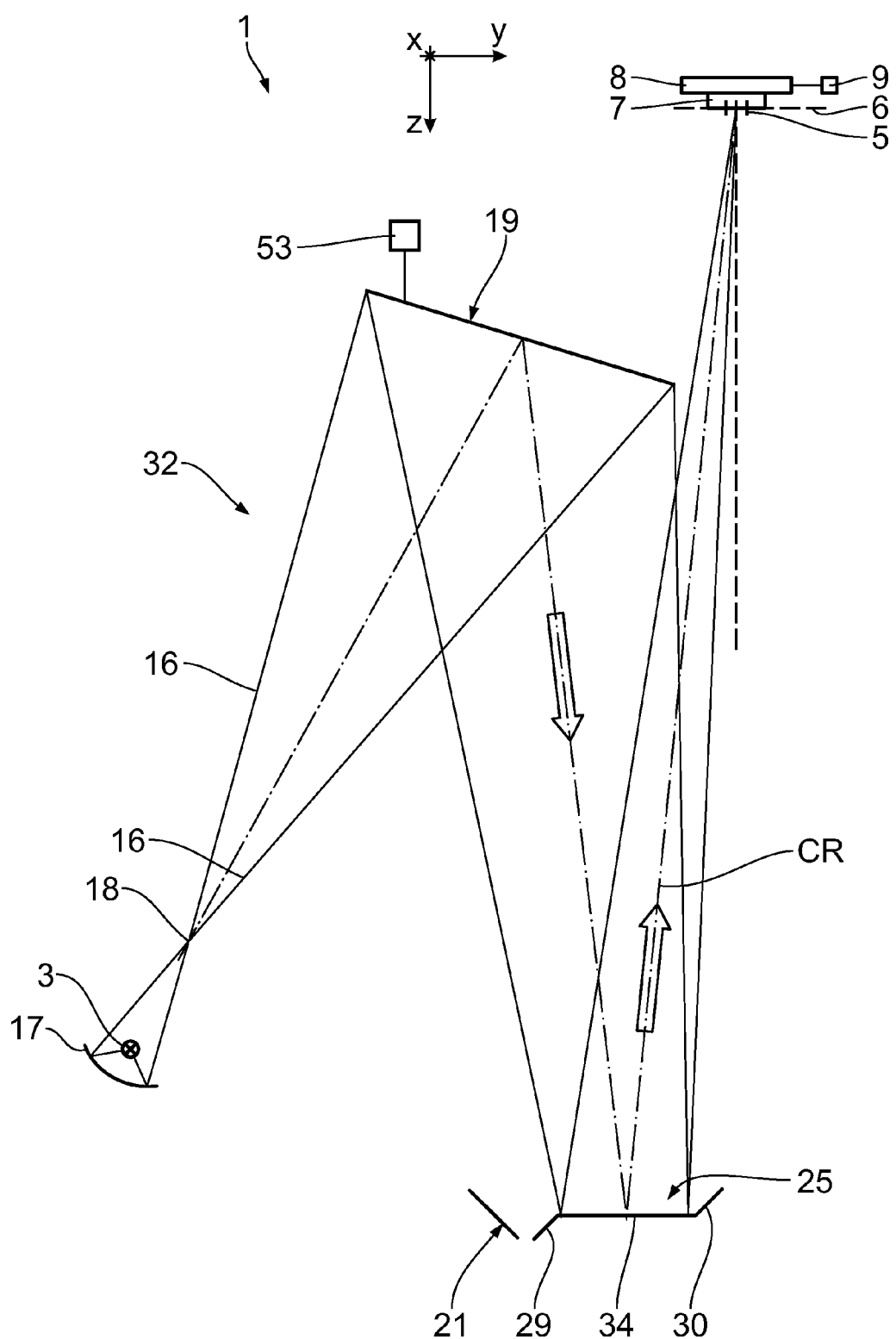
Figure 10:
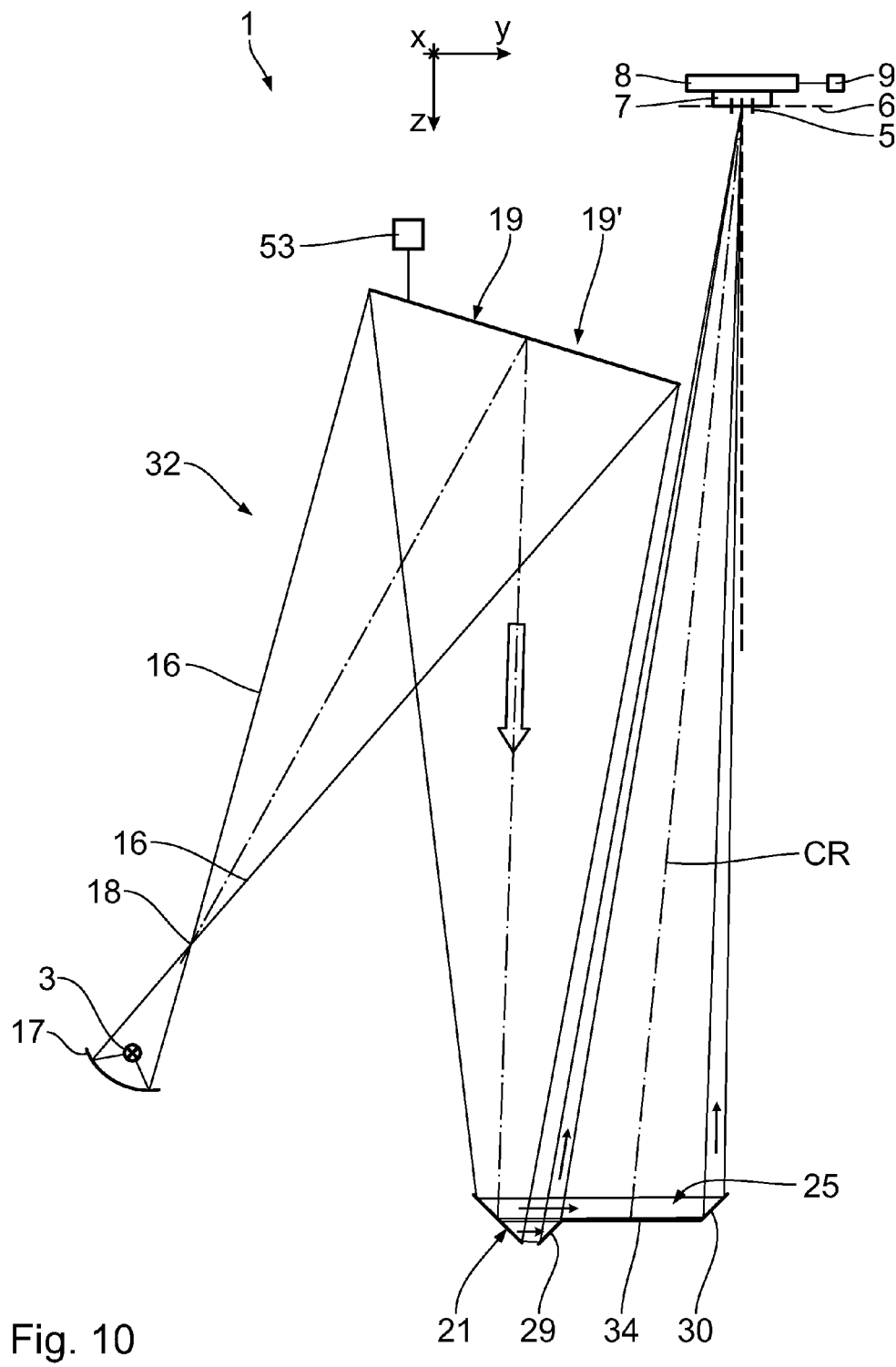
Figure 11:
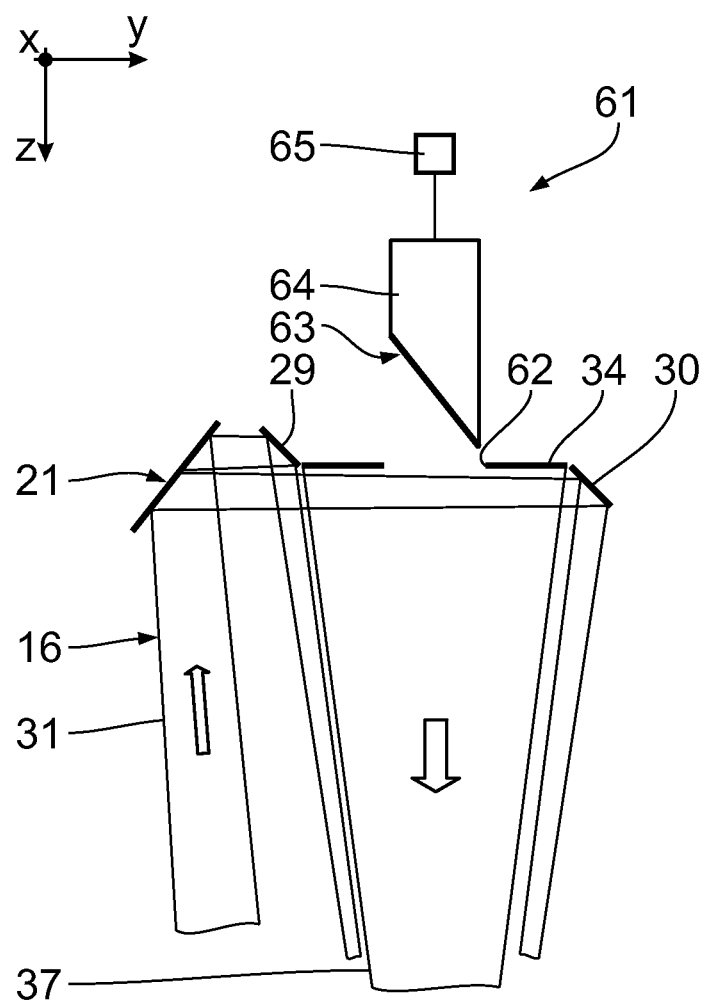
Figure 12:
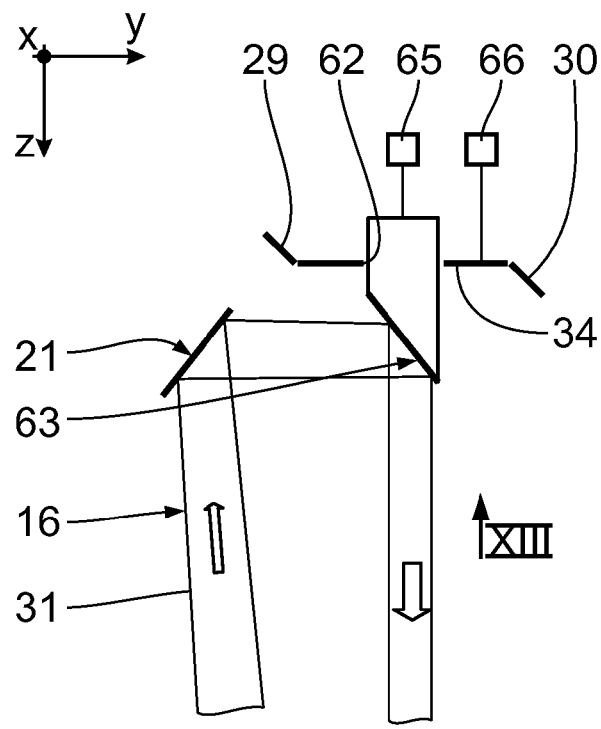
Figure 13:
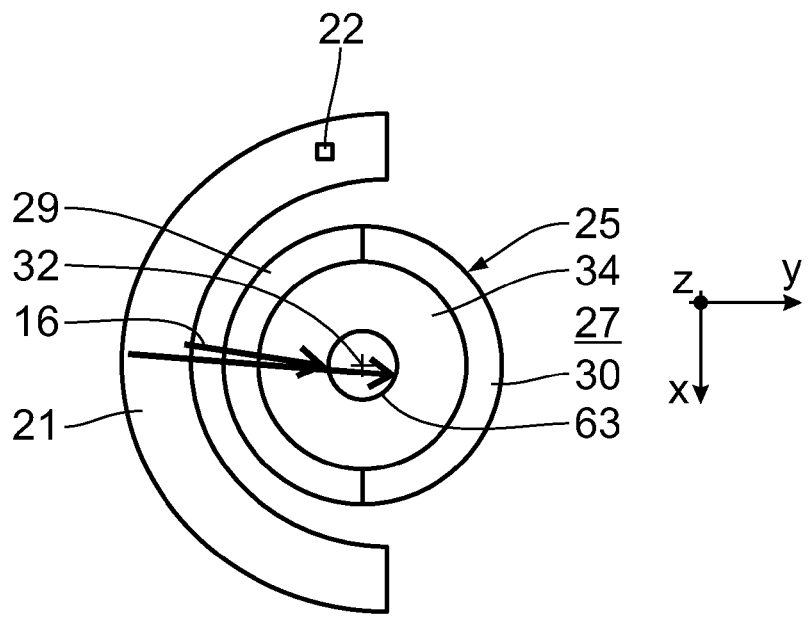
Figure 14:
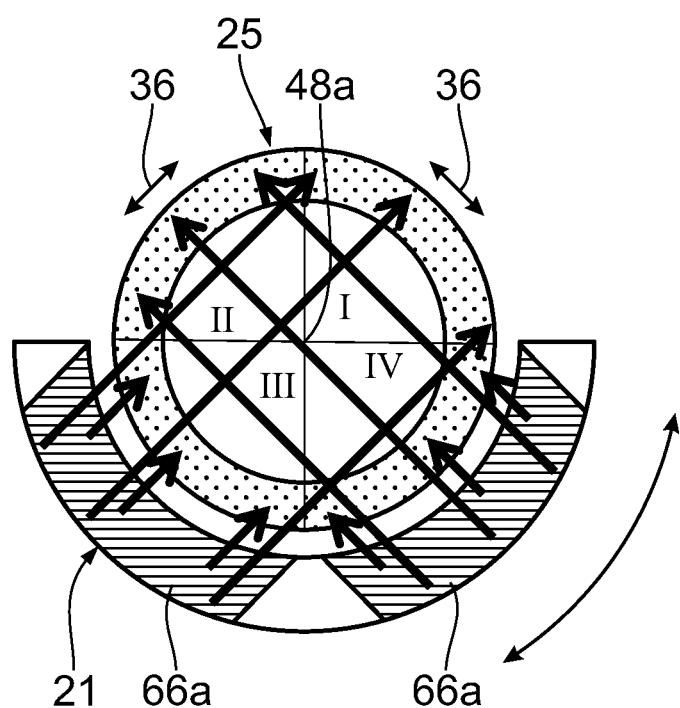

FIG. 9 shows a further embodiment of an illumination optical unit comparable to the optical unit according to FIG. 6, with an optical component, comprising a deflection facet mirror and a pupil facet mirror with a pupil facet neutral section and two polarization sections in the style of the embodiment in FIG. 1, with an illumination beam path, which is incident on the pupil facet mirror neutral section;

FIG. 10 shows the illumination optical unit according to FIG. 9, with an illumination beam path, in which the illumination light is incident on the polarization sections of the pupil facet mirror;

FIG. 11 shows, in an illustration similar to FIG. 5, a further embodiment of a pupil facet mirror with pupil facet mirror sections separate from one another in a first relative position in relation to one another, in which both a pupil facet mirror polarization section and a pupil facet mirror neutral section, associated therewith, are impinged upon by the illumination light;

FIG. 12 shows the pupil facet mirror and the deflection facet mirror according to FIG. 11 in a further relative position of the separate pupil facet mirror sections, in which the illumination light impinges upon the pupil facet mirror polarization section that was inactive in the relative position according to FIG. 11;

FIG. 13 shows, in an illustration similar to FIG. 3, the pupil facet mirror and the deflection facet mirror according to FIGS. 11 and 12, as seen from the direction XIII in the FIG. 12; and FIG. 14 shows, in an illustration similar to FIG. 3, a top view of a pivotable embodiment of the pupil facet mirror and of the deflection facet mirror, embodied for realizing a quadrupole illumination with predeterminable quadrupole orientation relative to the scanning direction of the projection exposure apparatus.

FIG. 1 shows, very schematically, a microlithographic projection exposure apparatus 1 in a meridional section.

In addition to a radiation or light source 3, an illumination system 2 of the projection exposure apparatus 1 comprises an illumination optical unit 4 for exposing an object field 5 in an object plane 6.

In order to simplify explanations of positional relationships, a Cartesian xyz-coordinate system is used hereinbelow in the drawing. The x-axis extends perpendicularly into FIG. 1. A y-axis extends to the right in FIG. 1. A z-axis extends perpendicular to the xy-plane and downward in FIG. 1. The z-axis extends perpendicular to the object plane 6.

In selected subsequent figures, a local Cartesian xyz-coordinate system has been plotted, wherein the x-axis extends parallel to the x-axis according to FIG. 1 and the y-axis spans the optical surface or the reflection surface of the respective optical element with this x-axis. The y-axis of the local xyz-coordinate system may be tilted to the y-axis of the global Cartesian xyz-coordinate system according to FIG. 1.

The object field 5 can have a rectangular or arctuate embodiment with an x/y-aspect ratio that is greater than 1 and, for example, equals 13/1, 10/1 or 3/1. The illumination optical unit 4 is used to expose a reflecting reticle 7, which is arranged in the object field 5 and supports a structure to be projected by the projection exposure apparatus 1 for producing microstructured or nanostructured semiconductor components. The reticle 7 is supported by an object or reticle mount 8, which, when driven by an object displacement drive 9, can be displaced in the y-direction. A projection optical unit 10, which is depicted very schematically in FIG. 1, serves for imaging the object field 5 in an image field 11 in an image plane 12. As a totality of the optical components of the projection exposure apparatus 1, the illumination optical unit 4 and the projection optical unit 10 form an optical system. The structure on the reticle 7 is imaged on a light-sensitive layer of a wafer 13 arranged in the region of the image field 11 in the image plane 12. The wafer 13 is supported by the wafer mount 14, which, with the aid of a wafer displacement drive 15, is displaced in the y-direction in a driven manner synchronously with the reticle mount 8 during the projection exposure. In practice, the reticle 7 and the wafer 13 are in fact significantly larger than the object field 5 and the image field 11.

During the operation of the projection exposure apparatus 1, the reticle 7 and the wafer 13 are scanned synchronously in the y-direction. Depending on the linear magnification of the projection optical unit 10, there can also be scanning of the reticle 7 relative to the wafer 13 in opposite directions.

The radiation source 3 is an EUV radiation source with an emitted used radiation in the range between 5 nm and 30 nm. Here, this can be a plasma source, e.g. a GDPP (gas discharge produced plasma) source, or an LPP (laser produced plasma) source. Other EUV radiation sources, for example those that are based on a synchrotron or a free electron laser (FEL), are also possible.

An EUV radiation beam 16, which emanates from the radiation source 3 and is indicated in FIG. 1 by a dash-dotted chief ray, is focused by a collector 17. By way of example, an appropriate collector is known from EP 1 225 481 A. The EUV radiation beam 16 is also referred to as used radiation, illumination light or imaging light in the following text.

After the collector 17, the EUV radiation beam 16 propagates through an intermediate focus 18 before it impinges on a field facet mirror 19. A spectral filter, which separates the used EUV radiation beam 16 from other wavelength components of the emission by the radiation source 3, which components cannot be used for the projection exposure, can be arranged in front of the field facet mirror 19. The spectral filter has not been depicted.

The field facet mirror 19 is arranged in a plane, which is optically conjugate to the object plane 6, of the illumination optical unit 4. The field facet mirror 19 comprises a multiplicity of field facets 20, of which merely a few are schematically depicted in FIG. 1. The field facet mirror 19 can have several hundred field facets 20. The field facets 20 of the field facet mirror 19 have an x/y-aspect ratio which corresponds approximately to the x/y-aspect ratio of the object field 5. Therefore, the field facets 20 have an x/y-aspect ratio which is greater than 1. A long facet side of the field facets 20 extends in the x-direction. A short facet side of the field facets 20 extends in the y-direction (scanning direction).

The field facet mirror 19 can be embodied as a microelectromechanical system (MEMS). Then, it comprises a multiplicity of field facet individual mirrors arranged like a matrix in rows and columns in an array, with the mirrors not being depicted in any more detail in the drawing. An example for such an individual mirror subdivision is provided in US 2011/0001947 A1. The facet individual mirrors can have square or rectangular reflection surfaces, or also reflection surfaces with different edges, for example in the form of diamonds or parallelograms. Edge shapes of the facet individual mirrors can correspond to those known from the theory of tessellation. In particular, use can be made of the tessellation known from US 2011/0001947 A1 and the references cited therein.

The facet individual mirrors can have plane or curved, e.g. concave, reflection surfaces. The facet individual mirrors are each connected to actuators and designed to be tiltable about two axes perpendicular to one another in the reflection plane of the respective facet individual mirror. These actuators are signal connected in a manner not depicted here to a central control device 24 (cf. FIG. 1), by which the actuators can be triggered for individual tilting of the facet individual mirrors.

Overall, the field facet mirror 19 has approximately 100 000 facet individual mirrors. Depending on the size of the facet individual mirror, the field facet mirror 19 also can have e.g. 1000, 5000, 7000 or else several hundred thousand, e.g. 500 000, facet individual mirrors. Alternatively, the number of facet individual mirrors can also be significantly lower. The facet individual mirrors are combined in groups, wherein respectively one of the facet individual mirror groups forms one of the field facets 20. An example for such a group combination is likewise provided by US 2011/0001947 A1. The facet individual mirrors can have a highly reflecting multi-layer, which is optimized for the respective angle of incidence and the wavelength of the EUV used light 16. As an alternative to a square form, the field facet individual mirrors can also have reflection surfaces whose aspect ratio e.g. deviates by more than 50% from the value 1. Such field facet individual mirrors with an aspect ratio deviating from the value 1 can be arranged in such a way that a projection of the field facet individual mirrors in the beam direction of the illumination light 16 has an aspect ratio in the region of the value 1.

The field facets 20 reflect partial beams of the illumination light 16 onto a deflection facet mirror 21.

Deflection facets 22 of the deflection facet mirror 21 in turn reflect partial beams of the illumination light 16 onto a pupil facet mirror 25.

Figure 2:
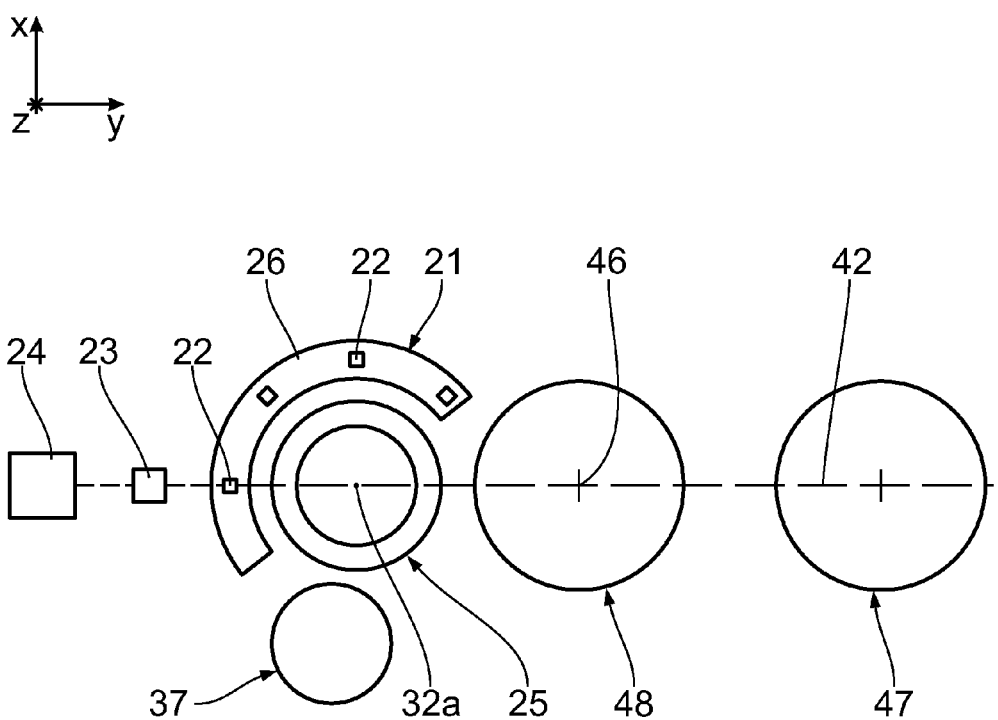

The deflection facets 22 are arranged on a deflection mirror support 26, which is arranged around the pupil facet mirror 25 as a partial ring, namely as a semicircle. This is depicted in FIG. 2. A mirror support surface of the deflection facet mirror 21, which is predetermined by the deflection mirror support 26, is angled in relation to a ring plane 27 of the deflection mirror support 26 and surrounds the ring-shaped deflection mirror support 26 as a cone section. The ring plane 27 approximately coincides with the sectional plane in FIG. 2 (cf. line II-II in FIG. 1). The ring plane 27 furthermore approximately coincides with the pupil plane, in which the pupil facet mirror 25 is arranged. The deflection facets 22 are arranged on the deflection mirror support 26, wherein the reflection surface of the deflection facets is preferably parallel to the local orientation of the mirror support surface of the deflection mirror support 26. A tilted orientation of the reflection surface of the deflection facets 22 with respect to the local mirror support surface of the deflection mirror support 26 is also possible. With the aid of actuators 23, an orientation of the reflection surfaces of the deflection facets 22 can be tilted about two axes.

The pupil facet mirror 25 lies in the region which is optically conjugate to a pupil plane of the projection lens 10. Simultaneously, the pupil facet mirror 25 is arranged in the region of a plane, in which the light source 3 or the intermediate focus 18 is imaged.

The pupil facet mirror 25 has a multiplicity of pupil facets 28, of which some are depicted schematically as points in FIG. 3. Some partial beams of the illumination light 16 impinging on the pupil facet mirror 25 via the deflection facet mirror 21 are depicted by arrows in FIG. 3. Here, in order to improve the clarity, the deflection facet mirror 21 is depicted in such a way that the reflecting side thereof faces a user and not, as emerges per se from the view according to FIG. 1, the rear side thereof. Each of the deflection facets 22 guides the illumination light 16 reflected by a field facet 20 over exactly one pupil facet 28. By switching the orientation of the deflection facets 22 with the aid of the actuators 23, light from different field facets 20 alternatively also can be guided over one and the same pupil facet 28.

The field facets 20 of the field facet mirror 19 are imaged in the object field 5 via a transfer optical unit, which is either formed by the deflection facet mirror 21 and the pupil facet mirror 25 or which includes further components between the field facet mirror 19 and the object field 5 and, in particular, between the pupil facet mirror 25 and the object field 5. Provided it is completely illuminated by the illumination light 16, each one of the field facets 20 can be imaged in the whole object field 5. The field facets 20 in turn can be built up from a plurality of individual mirrors. The pupil facets 28 in turn can be built up from a plurality of individual mirrors.

The field facets 20 of the field facet mirror 19, the deflection facets 22 and the pupil facets 28 of the pupil facet mirror 25 carry multilayer reflection coatings, which are adapted to the wavelength of the used light 16. The pupil facets 28 can have a round, hexagonal or rectangular embodiment and be arranged in accordance with the associated symmetries.

The pupil facet mirror 25 has more than hundred to several thousand pupil facets 28, for example 10 000 pupil facets 28. The number of field facets 20 of the field facet mirror 19 can equal or be less than the number of pupil facets 28 of the pupil facet mirror 25. The number of deflection facets 22 corresponds to the number of pupil facets 28 and, in particular, is exactly equal.

The field facets 20 and the pupil facets 28 are each arranged on a facet mirror support not depicted here in any more detail. In the exemplary embodiment, the facet mirror support of the facet mirror 19 has a planar embodiment. Alternatively, the facet mirror support can also have curved embodiment, e.g. a spherically curved embodiment.

The pupil facet mirror 25 has two outer polarization sections 29, 30, which are each embodied as lateral frustum sections. The pupil facet mirror polarization sections 29, 30 are arranged in such a way that angles of incidence α of an illumination beam path 31 at the pupil facets 28 of these polarization sections 29, 30 deviate by at most 20° from a Brewster angle of the multilayer reflection coating on the pupil facets 28 of the polarization sections 29, 30. The illumination beam path 31 of the illumination light 16 extends along illumination channels, which are each formed by one of the field facets 20 and by one of the pupil facets 28. These facets 20, 28 of in each case one of the illumination channels are aligned for guiding a partial beam of the illumination light 16.

Figure 7:
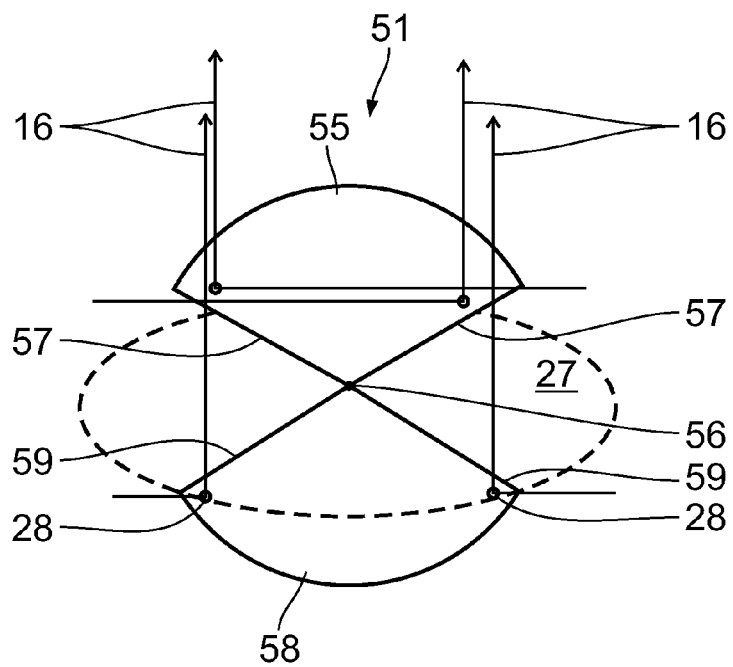
FIG. 7 shows a perspective view of a polarization section of the pupil facet mirror in the embodiment according to FIG. 6, as seen from the viewing direction VII in FIG. 6.

The polarization section 29, with a partial ring shape in the plan view according to FIG. 3, of the pupil facet mirror 25 lies in the illumination beam path between the pupil plane 27 and the field facet mirror 19. A cone tip of the section of half a frustum of the polarization section 29 lies on a normal through a center 32a of the mirror support of the pupil facet mirror 25. Here, the center 32a of the pupil facet mirror 25 is defined as the center of a circumferential contour of the pupil facet mirror support, projected onto the pupil plane 27 of the illumination optical unit 4. This pupil plane 27 is depicted in perspective in FIG. 7.

A mirror support surface of the polarization section 29, which is predetermined by a support design for the pupil facets 28, has a convex design. Half of the opening angle of the cone of which the frustum-shaped polarization section 29 forms a section is approximately 45°. An azimuth angle of this frustum section of the polarization section is approximately 180°. This azimuth angle lies between end edges 33 of the polarization section 29. These end edges 33 extend along straight lateral lines of the frustum section of the polarization section 29.

The second polarization section 30 constitutes a complement to a partial ring shape of the above-described polarization section 29 such that, when viewed in the top view according to FIG. 3, the two polarization sections 29, 30 form a ring around a central pupil facet mirror neutral section 34 of the pupil facet mirror 28. The second polarization section 30 lies in the illumination beam path of the illumination light 16 between the pupil plane 27 and the object plane 6. The second polarization section 30 of the pupil facet mirror 25 likewise has a frustum shape in parts, wherein, in contrast to the convex polarization section 29, a mirror support surface of the second polarization section 30 has a concave embodiment. A cone tip of this concave frustum shape of the second polarization section 30 also lies on the normal of the pupil plane 27 through the center 32a of the pupil facet mirror 25. In the top view according to FIG. 3, end edges 35 of this second polarization section 30 practically coincide with the end edges 33 of the first polarization section 29. As seen in projection on the pupil plane 27, these end edges 33, 35 can delimit a joint between the polarization sections 29, 30.

Half of the opening angle of the frustum section of the second polarization section 30 has the same size as that of the first polarization section 29, i.e. it is also approximately 45°. The frustum section of the second polarization section 30 also sweeps over an azimuth angle of approximately 180°.

This embodiment of the two polarization sections 29, 30, with the double frustum in sections, ensures that the polarization sections 29, 30 of the pupil facet mirror 25 form a line extending in a straight line and inclined at the same angle to the pupil plane 27, as viewed radially toward the center 32a of the pupil facet mirror 25 from each circumferential angle position of the deflection facet mirror 21.

Provided the illumination light 16, as depicted in an exemplary manner in FIGS. 3 to 5, in the projection onto the pupil plane 27 is, to a good approximation, directed radially from the deflection facets 22 to the pupil facets 28 with respect to the center 32a of the pupil facet mirror 25, all partial beams of the illumination light 16 at the pupil facets 28 of the polarization sections 29, 30 are, to a good approximation, deflected with the same angle of incidence $\alpha_p$. By way of example, this angle of incidence lines around the Brewster angle of incidence of approximately 43° with a deviation of the most 20°, alternatively of at most 15°, of at most 10°, of at most 5° or of the most 3°. Thus, in the polarization sections 29, 30 of the pupil facet mirror 25, the pupil facets 28 and the pupil facet mirror 25 act as polarizers. Depending on a location on the deflection facet mirror 21 from which the illumination light 16 is directed to the polarization sections 29, 30 of the pupil facet mirror 25, this results in a partial beam of the illumination light 16 with appropriate linear polarization perpendicular to the respective plane of incidence.

In the projection on the pupil plane 27, as indicated in FIG. 3 by polarization arrows 36, the resulting polarization directions extend tangentially to the semicircle shape of the deflection facet mirror 21. Since it is therefore possible to produce all linear polarization directions in the xy-plane, it is possible to produce an illumination pupil with tangential polarization via reflection on the polarization sections 29, 30, as indicated by the corresponding polarization arrows 36 on the pupil facet mirror 25 in FIG. 3.

The neutral section 34 of the pupil facet mirror 25 arranged centrally on the mirror support of the pupil facet mirror 25 is arranged in such a way that angles of incidence αN of an illumination beam path 37 of the illumination light 16 along the illumination channels deviate by at most 20° from normal incidence at the pupil facets 28 of the neutral section 34. Depending on the geometry of the beam deflection over the deflection mirror 45 of the illumination optical unit 4, a deviation of the angle of incidence of the illumination beam path of the illumination light 16 along the illumination channels when reflected at the pupil facets 28 of the neutral section 34 of the pupil facet mirror 25 can also be less than 20°; by way of example, it can be at most 15°, at most 10°, at most 5° or else at most 3°.

The neutral section 34 of the pupil facet mirror 25 extends approximately in the pupil plane 27. The polarization sections 29, 30 are each formed, in a semicircular shape, on the neutral section 34 via outer edges 38.

In the illumination beam path 31, the illumination light 16 is directed to a beam forming mirror 39 by the polarization sections 29, 30 of the pupil facet mirror 25. The beam forming mirror 39 causes an exit pupil of the illumination optical unit 4 to lie more than 5 m in front of the object field 5 in the illumination beam path. Alternatively, it is possible to obtain a position of the exit pupil of the illumination optical unit 4 at infinity, i.e. it is possible to obtain telecentricity of the illumination optical unit, or a position of the exit pupil the illumination beam path behind the object field 5, i.e. in the imaging beam path of the projection optical unit 10 downstream. The pupil facets 28 of the polarization sections 29, 30 cause direct impingement upon the beam forming mirror 39 via the illumination beam path 31.

The central chief ray 40 of the illumination beam path 37 for the neutral section 34 of the pupil facet mirror 25 is not guided in a main guiding plane 42 of the central chief ray 41 of the illumination beam path 31 for the polarization sections 29, 30 of the pupil facet mirror 25. The main guiding plane 42, which coincides with the plane of the drawing in FIG. 1, is defined by a center 43 of a reflection surface of the field facet mirror 19, the center 32a of the reflection surface of the pupil facet mirror 25 and by a central object field point 44.

The illumination light 16 in the illumination beam path 37 for the neutral section 34 is guided between the field facet mirror 19 and the neutral section 34 of the pupil facet mirror 25 via a deflection mirror 45 in the beam path 37. The deflection mirror 45 may be embodied as a mirror array with tiltable individual mirrors, but this is not mandatory. After reflection on the neutral section 34 of the pupil facet mirror 25, the central chief ray of the illumination beam path 37 coincides with the central chief ray 41 of the illumination beam path 31 for the two polarization sections 29, 30. The two illumination beam paths 31, 37 then extend along the same path 46, which is indicated in FIG. 1 by a dash-dotted line.

The two polarization sections 29, 30 and the neutral section 34 are sections of one and the same pupil facet mirror 25. Alternatively, it is possible to embody the sections 29, 30 and 34 as components that are separate from one another and, in particular, mounted separately from one another.

The intermediate focus 18 is in each case imaged on the pupil facets 28 illuminated by the beam 16 with the aid of the field facets 20 and, provided these are in the beam path, the deflection facets 22. An image of the intermediate focus 18 is created on each of the illuminated pupil facets 28. This imaging need not be perfect.

Illumination channels are respectively formed by one of the field facets 20 or by a field facet individual mirror group forming the latter, by one of the deflection facets 22, provided these are arranged in the beam path, and by one of the pupil facets 28. Depending on how many of the individual mirrors of the field facet mirror 19 contribute to the respective illumination channel, this intermediate focus image can be created as a superposition of the plurality of intermediate focus images which are created on the respective pupil facet 28 due to guiding the illumination light 16 over in each case one of the field facet individual mirrors. Here, the intermediate focus image need not be created exactly on the pupil facet 28 of the respective illumination channel. It suffices for the respective pupil facets 28 to be situated in the region of the intermediate focus image such that, in particular, the intermediate focus image lies completely on the pupil facet 28. It may also be sufficient for e.g. 95% of the illumination light energy of an illumination channel to fall on the respective pupil facet 28, i.e. if a small part of the intermediate focus image does not lie on the pupil facet 28.

The field facets 20 are imaged superposed on one another in the object field 5 with the aid of the deflection facets 22 and the pupil facets 28 and also with the aid of a beam forming mirror 39 arranged in the beam path of the beam 16 downstream of the pupil facet mirror 25. Depending on whether the illumination light 16 is guided along the illumination beam path 31 or along the illumination beam path 47, it is also possible for the deflection facets 22 of the deflection facet mirror 21 and the deflection mirror 45 to contribute to this superimposing imaging.

The chief ray angle at the reticle 7 between a chief ray CR of the illumination light 16 and a normal of the object plane 6 is e.g. 6° and may lie in the range between 3° and 8°. A total opening angle of the beam 16, which illuminates the object field 5, is adapted to this chief ray angle in such a way that the reflecting reticle 7 is imaged on the wafer in a homogeneous manner. A beam path 47 reflected by the reticle 7 lies completely outside of the beam path 48, incident on the reticle 7, of the illumination light 16 (cf. FIGS. 1 and 2).

FIG. 2 clarifies an arrangement in which the deflection facet mirror 21 is arranged bent asymmetrically with respect to the chief guiding plane an is in the form of a 180° arc around the pupil facet mirror 25 in such a way that both the deflection mirror support 26 and the illumination beam paths 37 and 48 are arranged as closely as possible to the pupil facet mirror 25.

Thus, the deflection facet mirror 21 is not arranged mirror-symmetrically with respect to a plane parallel to the yz-plane, but is arranged rotated about an axis parallel to the z-axis.

Depending on whether the field facets 20, the deflection facets 22 or the pupil facets 28 are components of the imaging transfer optical unit, the field facets 20 and/or the deflection facets 22 and/or the pupil facets 28 either have an imaging effect, i.e., in particular, have a concave design, or are embodied as pure deflection mirrors or plane mirrors or plane facets. The field facets 20 and/or the deflection facets 22 and/or the pupil facets 28 may carry correction aspheres for correcting aberrations of the illumination optical unit 4.

The pupil facets 28 of the polarization sections 29, 30 serve as polarization elements, which lead to the illumination light 16 being s-polarized in relation to the incidence plane of the respective illumination light partial beam on the pupil facet 28 after reflection on the pupil facets 28. In FIG. 1, this s-polarization is indicated by points on partial beams of the illumination light 16. The beams of the illumination beam path 31 propagating in the plane of the drawing of FIG. 1 therefore are polarized perpendicular to the plane of the drawing after reflection at the pupil facets 28.

The number of deflection facets 22 is at least as great as a number of field facets 20. In the embodiment according to FIG. 1, the number of deflection facets 22 in actual fact is much greater than the number of field facets 20 and, in particular, can be 10 times as great or even greater. The illumination optical unit 4 is embodied in such a way that the field facets 20 are not imaged on the deflection facets 22 and the deflection facets 22 are not imaged on the pupil facets 28.

FIG. 4 shows the illumination beam path 37 incident on the neutral section 34 and FIG. 5 shows the illumination beam path 37 reflected by the pupil facets 28 of the neutral section 34. Moreover, the illumination beam path 31 is respectively depicted in sections in FIGS. 4 and 5, wherein FIG. 5 also depicts the part of the illumination beam path 31 reflected by the polarization sections 29, 30.

In one variant of the illumination optical unit 4, firstly the deflection facet mirror 21 and secondly the pupil facet mirror 25 are pivotable about a common is pivot axis 48a, which pivot axis extends through the center 32a of the pupil facet mirror 25 and along an optical axis of the illumination light 16 between the pupil facet mirror 25 and the object field 5. By way of example, the deflection facet mirror 21 and the pupil facet mirror 25 can be rotated about the pivot axis 48a by pivot angles in the range of +/−45°. This pivoting can be brought about by common control, or else by control independent of one another. For pivoting purposes, the deflection facet mirror 21 and the pupil facet mirror 25 are functionally connected either to a common pivot drive or in each case to their own pivot drive, which is depicted very schematically at 48b in FIG. 1. The pivot drive 48b can be a stepper motor.

Furthermore, in this variant of the embodiment of the illumination optical unit 4, the field facet mirror 19 is pivotable about a pivot axis 48c, which extends through the center of the field facet mirror support and is perpendicular to a main reflection plane of the field facet mirror 19. A pivotability of the field facet mirror 19 about the pivot axis 48c can lie in the range of +/−90°. For pivoting purposes, the field facet mirror has a functional connection to a pivot drive 48d, which is likewise indicated very schematically in FIG. 1. The pivot drive 48d likewise can be a stepper motor.

The pivot drives 48b and 48d have signal connection to the central control device 24.

During pivoting, the pivot drives 48b, 48d can be actuated in such a way that the field facet mirror 19 is pivoted by twice the size of the pivot angle compared to the common pivoting of the deflection facet mirror 21 and of the pupil facet mirror 25.

By way of example, the embodiment of the illumination optical unit with overall pivotable facet mirrors 19, 21, 25 is used when e.g. exactly one linear polarization direction or exactly two linear polarization directions of the illumination of the object field 5 are to be predetermined, wherein the orientation of these linear polarization directions is predetermined depending on the respective pivot angles about the pivot axes 48a and 48c. By way of example, if exactly one polarization direction is to be predetermined for the illumination of the object field 5 or if exactly two polarization directions, perpendicular to one another in the object plane 6, are to be predetermined for the illumination of the object field 6, this results in an illumination geometry in which the field facets 20 of the field facet mirror 19 can be arranged in a closely packed manner. This pivotable embodiment will still be explained in more detail below on the basis of FIG. 14.

In the variant with the pivotable deflection facet mirror 21 and the pivotable pupil facet mirror 25, it is also possible to dispense with pivotability of the field facet mirror 19 in the case where the field facet mirror 19 has field facets 20 which are made of micro-mirrors. In this case, the field facets 20 then can be aligned in accordance with the respective pivot position of the deflection facet mirror 21 and of the pupil facet mirror 25 via a group assignment of the micromirrors adapted hereto.

A further embodiment of an illumination optical unit 49, which can be used in the projection exposure apparatus 1 in place of the illumination optical unit 4, will be explained below on the basis of FIG. 6. Components and functions corresponding to those that were already explained above with reference to FIGS. 1 to 5 carry the same reference signs and will not be discussed again in detail below. FIG. 6 shows the beam path of the illumination light 16 between the intermediate focus 18 and the object field 5.

In the embodiment according to FIG. 6, the field facet mirror 19 overall is embodied tiltable in such a way that, depending on tilt positions of the field facet mirror 19, illumination light 16 optionally can be applied either to a polarization section 51 of the pupil facet mirror 25 via the deflection facet mirror 21, as indicated in FIG. 6 by an illumination beam path 50, or directly to a neutral section 52 of the pupil facet mirror 25. A tilt position of the field facet mirror 19 for impinging upon the deflection facet mirror 21 and, subsequently, the polarization section 51 is depicted by a full line in FIG. 6. The corresponding tilt position of the field facet mirror, then denoted by 19', for actuating the neutral section 52 of the pupil facet mirror 25 is depicted by a dashed line. For the purposes of tilting the field facet mirror 19, the latter is connected to a tilt actuator 53, which is depicted schematically in FIG. 6.

The polarization section 51 of the pupil facet mirror 25 is connected to a displacement actuator 54, which is likewise depicted schematically in FIG. 6. Using the displacement actuator 54, it is possible to move the polarization section 51 from a reflection position depicted in FIG. 6, in which the polarization section 51 guides the illumination light 16 from the deflection facet mirror 21 to the object field 5, to an ineffective position, in which the polarization section 51 has been completely displaced into the beam path of the illumination light 16. In this ineffective position of the polarization section 51, the neutral section 52 of the pupil facet mirror 25 is available for reflecting the illumination light 16 from the field facet mirror 19 to the object field 5.

A mirror support of the polarization section 51 of the pupil facet mirror 25 in the embodiment according to FIG. 6 has the shape of a lateral double cone section.

A first lateral cone section 55 lies in the beam path of the illumination light 16 between the pupil plane 27 and the object plane 6. A mirror support surface of the first lateral cone section 55 forms a concave half cone, the cone tip 56 of which, which simultaneously constitutes the tip of the double cone, lying in the pupil plane 27. Half an opening angle β of the cone, the lateral cone section 55 forming a section thereof, is approximately 45°. An azimuth angle γ of the lateral cone section 55 is 180°. This azimuth angle γ lies between end edges 57 of the lateral cone section 55. These end edges 57 extend along straight lateral lines of the lateral cone section 55.

Figure 8:
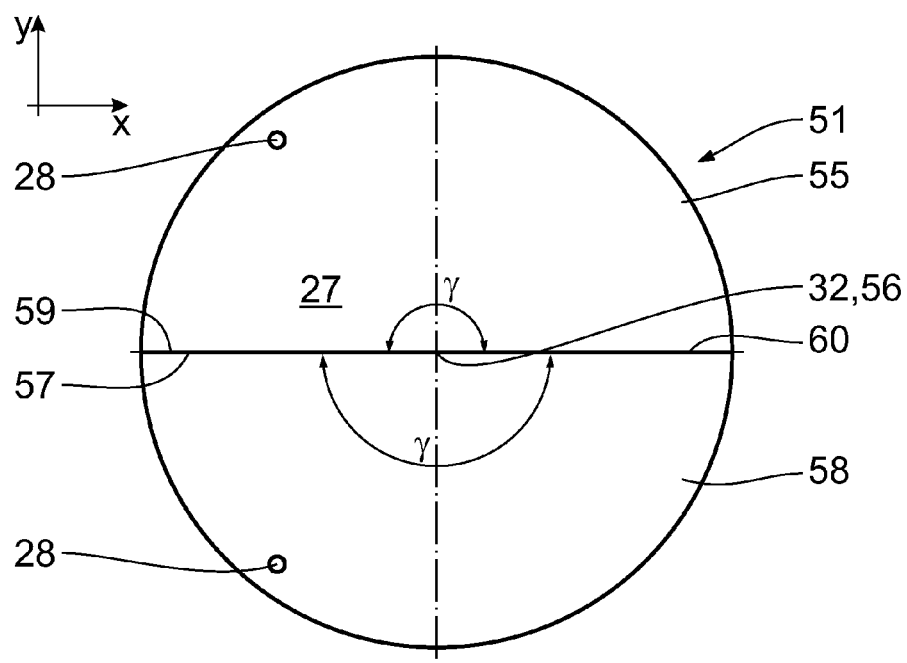
FIG. 8 shows the polarization section of the embodiment according to FIGS. 6 and 7, as seen from the viewing direction VIII in FIG. 6.

The double cone section form of the pupil facet mirror 25 of the illumination optical unit 49 is complemented by a further lateral cone section 58, the cone tip 56 of which coincides with the cone tip 56 of the lateral cone section 55 described above. End edges 59 of the second lateral cone section 58 constitute extensions of the end edges 57 of the first lateral cone section 55 through the cone tip 56. The end edges 57 and 59 delimit a joint 60 between the lateral cone sections 55, 58, as seen in a projection on the pupil plane 27 (cf. FIG. 8).

A mirror support surface of the second lateral cone section 58 has a convex arc. Half of the opening angle β of the second lateral cone section 58 has exactly the same size as half the opening angle β of the first lateral cone section 55. The lateral cone section 58 also sweeps over an azimuth angle γ of approximately 180°.

The double cone arrangement of the two lateral cone sections 55, 58 and the associated arrangement of the semicircle-shaped deflection facet mirror 21 is such that the pupil facet mirror 25 forms a straight line inclined at the same angle δ with respect to the pupil plane 27 when observed from any circumferential angle of the deflection facet mirror 21. Expressed differently, a sectional figure with the deflection facet mirror 21 and the pupil facet mirror 25 is a straight line for each plane of the drawing analogous to FIG. 6 through an optical axis (CR in FIG. 6) between the deflection facet mirror 21 and the reticle 7.

Provided the illumination light 16, to a good approximation, is directed radially with respect to the center 32a of the pupil facet mirror 25 in the projection on the pupil plane 27 from the deflection facets 22 to the pupil facets 28, all partial beams of the illumination light 16 are deflected at the pupil facets 28 with the same angle of incidence. Once again, this angle of incidence lies around the Brewster angle of incidence of approximately 43° with a deviation of at most 20°, alternatively of at most 15°, of at most 10°, of at most 5° or of at most 3°, such that the pupil facets 28 of the pupil facet mirror 25 act as polarizers for the correspondingly deflected illumination light 16. Depending on from which location of the deflection facet mirror 21 the light is guided to the pupil facet mirror 25, this results in a partial beam of the illumination light with an appropriate linear polarization.

In the projection on the pupil plane 27, the resulting polarization directions extend tangentially to the semicircular form of the deflection facet mirror 21. Since it is therefore possible to produce all linear polarization directions, it is possible to produce an illumination pupil with tangential polarization.

The neutral section 52 of the pupil facet mirror 25 has a plane mirror support surface, which is arranged perpendicular to the plane of the drawing of FIG. 6, i.e. in the xy-plane.

The polarization section 51 and the neutral section 52 constitute two sections of the pupil facet mirror 25 which are separate from one another in the embodiment according to FIG. 6.

As an alternative to a field facet mirror 19 which can be tilted overall, the embodiment according to FIG. 6 can also be embodied in such a way that a change between the illumination beam path 50 to the deflection field facets 21 and the illumination beam path to the neutral section 52 of the pupil facet mirror 25 is brought about in each case by tilting the individual field facets 20 of the field facet mirror 19. The field facet mirror 19 is then embodied with tiltable field facets 20 in such a way that the illumination light 16 alternatively can impinge upon either the polarization section 51 or the neutral section 52 of the pupil facet mirror 25, depending on the tilt position of the field facets.

FIGS. 9 and 10 show a variant of the illumination optical unit 32 according to FIG. 6, comprising a deflection facet mirror 21 and a pupil facet mirror 25 in the style of the illumination optical unit 4 according to FIGS. 1 to 5.

FIG. 9 shows the illumination situation in which the field facet mirror 19 is tilted in such a way that it guides the illumination light 16 to the pupil facet mirror neutral section 34.

FIG. 10 shows an illumination situation in which the pupil facet mirror 19' is displaced into the tilt position in which the polarization sections 29, 30 of the pupil facet mirror 25 are actuated via the deflection facet mirror 21. This then results in the illumination variants which were already explained above in conjunction with FIGS. 4 and 5 and in conjunction with the tilt variant of the field facet mirror 19 in FIG. 6.

In the illumination situation according to FIG. 9, it is possible to achieve unpolarized operation with illumination angles up to a maximum illumination angle. In the illumination situation according to FIG. 10, it is possible to achieve an illumination of the object field 5 in a polarized operation with large illumination angles in absolute terms.

Variants of the illumination optical units 32 once again can be embodied in such a way that the deflection facet mirror 21, the pupil facet mirror 25 and optionally the field facet mirror 19 can be pivoted in a pivotable manner for predetermining a polarization orientation and/or for predetermining an orientation of an image of the field facets 20 on the object field 5. To this end, the facet mirrors 21, 25 and optionally 19 can interact with pivot drives, this not being depicted in any more detail in FIGS. 6 to 10.

In the following text, a further embodiment of an illumination optical unit 61 is described on the basis of FIGS. 11 to 13, which illumination optical unit can be used in place of the illumination optical unit 4 or 49 in the projection exposure apparatus 1. Components and functions corresponding to those that were already explained above with reference to FIGS. 1 to 10 carry the same reference signs and will not be discussed again in detail below.

In the illumination optical unit 61, the neutral section 34 of the pupil facet mirror 25 is provided with a central passage opening 62. The latter is embodied for the through passage of a further polarization section 63, which is embodied as a polarization section separate from the polarization sections 29, 30, of the pupil facet mirror 25. A finger-shaped support body 64 of the further polarization section 63 is embodied to be displaceable along a displacement direction perpendicular to the plane of the neutral section 34 via a displacement actuator 65.

FIG. 11 shows the further polarization section 63 of the pupil facet mirror 25 in an ineffective position. The pupil facet mirror 25 according to FIG. 11 then, in principle, operates as explained above with reference to FIGS. 1 to 5, 9 and 10. It is only in the region of the passage opening 62 that is not possible now to reflect illumination light 16 by the neutral section 34.

FIGS. 12 and 13 show the pupil facet mirror 25 according to FIG. 11 in an effective position of the further, central polarization section 63. To this end, the further polarization section 63 has been moved through the passage opening 62 of the neutral section 34 by the displacement actuator 65 such that the reflection surface of the polarization section 63, inclined by about 45°, comes to rest level with the deflection facet mirror 21 in the z-direction. At the same time, the further pupil facet mirror 25, i.e. the neutral section 34 and the polarization sections 29, 30 formed hereon, is displaced in the opposite direction, i.e. in the negative z-direction in FIG. 12, and therefore moved out of the illumination beam path 31. This displacement is brought about by a further displacement actuator 66, which is connected to the pupil facet mirror 25 in the region of the neutral section 34.

In the arrangement according to FIGS. 12 and 13, the illumination light 16 in the illumination beam path 31 is now deflected by the reflection surface of the polarization section 63 with an angle of incidence of approximately 43°, i.e. a Brewster angle of incidence, such that the illumination light 16 is polarized linearly and perpendicular to the plane of the drawing according to FIG. 12 after reflection on the polarization section 63.

As an alternative to polarization section 63 with a plane embodiment, the former can also be formed in the form of a convex lateral cone section corresponding to e.g. the polarization section 29 such that it is once again possible to produce linearly polarized light with different polarization directions by reflection at the lateral cone-shaped polarization section 63 by actuation of the semicircle-shaped deflection facet mirror 21, as explained above in conjunction with polarization sections 29, 30 and 51.

Beam guidance according to FIGS. 12 and 13 over the central polarization section 63 can preferably be used in conjunction with phase masks. A further application lies in dark field illumination of the reticle 7 in conjunction with an obscuration, conjugate to the polarization section 63, in the projection optical unit. Then, only the illumination light 16 that was diffracted at structures of the reticle 7 contributes to illuminate the wafer 13.

In the pupil facet mirror 25 according to FIGS. 11 to 13, the neutral section 34 is arranged around the central polarization section 63 in at least the shape of the partial circle; in the depicted exemplary embodiment, it is even arranged as a whole circle.

The pupil facet mirror 25 according to FIGS. 11 to 13 has two polarization sections separate from one another, namely firstly the central polarization section 63 and secondly the interconnected polarization sections 29, 30. As explained in an exemplary manner above in conjunction with the embodiment according to FIGS. 11 to 13, the different separate polarization sections of the pupil facet mirror can be displaceable with respect to one another and/or with respect to the at least one neutral section of the pupil facet mirror.

A plurality or else a multiplicity of the deflection facets 22 can be assigned to each one of the field facets 20. As a result of this, it is possible to distribute an illumination light partial beam, which emanates from one of the field facets 20 to be imaged in the object field 5, on a plurality of the pupil facets 28 via appropriately grouped individual mirrors or micromirrors of the field facet mirror 19. Therefore, facet section images of field facet sections constitute strips in the object field 5, which extend over a total object field height, i.e. over the total x-extent, of the object field 5 transversely to the object displacement direction y. Accordingly, it is possible to build up the image of one of the field facets 20 in the object field 5, for example line-by-line with lines offset in the y-direction, via different ones of the pupil facets 28. Therefore, it is possible to illuminate strip sections of the object field 5, which extend over the whole object field 5 in the x-direction, from different illumination directions in accordance with the position of the pupil facet 28, involved in this illumination, on the pupil facet mirror 25 via an appropriate tilt angle assignment of the micromirrors of the field facet 20. This is depicted in an insert in FIG. 1, which shows a top view of the e.g. rectangular object field 5. Depicted are a total of four such object field strips 5a to 5d, which are schematically separated from one another by the dashed lines. These object field strips 5a to 5d are images of facet sections of the field facets 20. An object field height, i.e. an overall extent of the object field 5 in the x-direction, is denoted by $5_x$ in this insert. A reticle point scanned through the object field 5 along the y direction then, in a scan-integrated manner, sees the illumination light from the various illumination directions.

In an illustration similar to FIGS. 3 and 11, FIG. 14 shows an embodiment of the deflection facet mirror 21 and of the pupil facet mirror 25 for producing a quadrupole illumination of the object field 5. In the quadrupole illumination, each object field point is illuminated by four illumination poles, which are each arranged in one of the quadrants of the illumination pupil. For each of the quadrants, the linear polarization 36 of the illumination light 16 has a polarization direction which is perpendicular to a connecting line between the center of the respective quadrant and the center of the illumination pupil.

In FIG. 14, the four quadrants in which the pupil facet mirror 25 is illuminated for the quadrupole illumination are numbered by I, II, III and IV, as is mathematically conventional. There is a linear polarization direction 36 parallel to the xy-angle bisector in quadrants I and III of the pupil facet mirror 25. The linear polarization 36 in the two other quadrants II and IV extends precisely perpendicular to this xy-angle bisector.

Deflection facets 22 of the deflection facet mirror 21 in deflection facet regions 66a, which are shaded on the deflection facet mirror 21 in FIG. 14, contribute to the appropriate illumination of the pupil facet mirror 25.

As already explained above in conjunction with FIG. 1, the two facet mirrors 21, 25 can be embodied to be pivotable about the pivot axis 48a. As a result of this, it is possible to adapt the polarization direction of the quadrupole illumination and the orientation of the poles of the quadrupole illumination to a predetermined value. A pivot movement, which the deflection facet mirror 21 executes together with the pupil facet mirror 25, is indicated in FIG. 14 by a double-headed arrow 67. Pivoting about the pivot axis 48a in the range of +/−45° can be predetermined for the deflection facet mirror 21 and the pupil facet mirror 25 by the common pivot drive 48b. The alignment of the field facets 20 of the associated field facet mirror 19 can be brought about either by pivoting of the field facet mirror 19 overall or, in the case of a micromirror embodiment of the field facets 20, by changing the assignment of micromirror groups to adapted field facets.

In the projection exposure, the reticle 7 and the wafer 13, which bears a light-sensitive coating for the EUV radiation beam 16, are provided. An illumination setting, i.e. for example a dipole setting or an annular setting or else a different setting, for example a conventional illumination setting or a multi-pole illumination setting, is set prior to the exposure. Subsequently, at least one section of the reticle 7 is projected onto the wafer 13 with the aid of the projection exposure apparatus 1. Finally, the light-sensitive layer on the wafer 13, exposed to the EUV radiation beam 16, is developed. The microstructured or nanostructured component, for example a semiconductor component, for example a microchip, is produced in this manner.

The invention claimed is:
1. An illumination optical unit, comprising:
a field facet mirror comprising a plurality of field facets; and at least one pupil facet mirror comprising a plurality of pupil facets, the pupil facet mirror comprising first and second sections;

wherein the illumination optical unit is configured so that, during use of the illumination optical unit:

light passes through the illumination optical unit along a path to illuminate an object field;

light passing along the path comprises a plurality of illumination channels;

each illumination channel guides a partial beam of the light;

each illumination channel is defined by a corresponding field facet and a corresponding pupil facet;

the field facets are imaged into the object field via a transfer optical unit;

light incident on the first section of the pupil facet mirror has its polarization state changed by the first section of the pupil facet mirror;

light incident on the second section of the pupil facet mirror does not have its polarization state changed by the second section of the pupil facet mirror;

angles of incidence of the illumination channels deviate at pupil facets of the first section of the pupil facet mirror by at most 20° from a Brewster angle of a multilayer reflection coating of the pupil facets of the first section of the pupil facet mirror; and angles of incidence of the illumination channels deviate at pupil facets of the second section of the pupil facet mirror by at most 20° from a normal incidence on the pupil facets of the second section of the pupil facet mirror.

2. The illumination optical unit of claim 1, wherein the field facets are tiltable so that, during use of the illumination optical unit, depending on a tilt position of the field facets, the first section of the pupil facet mirror and the second section of the pupil facet mirror are alternatively impinged upon by the light.

3. The illumination optical unit of claim 2, wherein the first section and the second section are sections of the same pupil facet mirror.

4. The illumination optical unit of claim 2, wherein the illumination optical unit is configured so that during use of the illumination optical unit:

a guiding of a central chief ray of the path for the second section lies outside of, at least in sections, a chief guiding plane of a central chief ray of the path for the first section; and the chief guiding plane is defined by a center of a reflection surface of the field facet mirror, a center of a reflection surface of the pupil facet mirror and a central object field point.

5. The illumination optical unit of claim 1, wherein the field facet mirror is overall tiltable so that, during use of the illumination optical unit, depending on a tilt position of the field facet mirror, the first section and the second section are alternatively impinged upon by the light.

6. The illumination optical unit of claim 5, wherein the first section and the second section are sections of the same pupil facet mirror.

7. The illumination optical unit of claim 5, wherein the illumination optical unit is configured so that during use of the illumination optical unit:

a guiding of a central chief ray of the path for the second section lies outside of, at least in sections, a chief guiding plane of a central chief ray of the path for the first section; and the chief guiding plane is defined by a center of a reflection surface of the field facet mirror, a center of a reflection surface of the pupil facet mirror and a central object field point.

8. The illumination optical unit of claim 1, wherein the illumination optical unit is configured so that during use of the illumination optical unit:

a guiding of a central chief ray of the path for the second section lies outside of, at least in sections, a chief guiding plane of a central chief ray of the path for the first section; and the chief guiding plane is defined by a center of a reflection surface of the field facet mirror, a center of a reflection surface of the pupil facet mirror and a central object field point.

9. The illumination optical unit of claim 1, wherein the first section is at least partially circular around the second section.

10. The illumination optical unit of claim 1, wherein the second section is at least partially circular around the first section.

11. The illumination optical unit of claim 1, wherein the first section or the second section is displaceable from the path of the light between the field facet mirror and the object field.

12. The illumination optical unit of claim 1, wherein the pupil facet mirror comprises at least two pupil facet mirror first sections which are separate from one another.

13. An optical system, comprising:
an illumination optical unit according to claim 1; and
a projection optical unit configured to image an object in the object field into an image field.

14. An illumination system, comprising:
an illumination optical unit according to claim 1; and
an EUV light source configured to provide the light.

15. An apparatus, comprising:
an EUV light source;
an illumination optical unit according to claim 1; and
a projection optical unit configured to image an object in the object field into an image field,
wherein the apparatus is a projection exposure apparatus.

16. A method of using a projection exposure apparatus comprising an illumination optical unit and a projection optical unit, the method comprising:
using the illumination optical unit to illuminate at least a portion of a reticle comprising structures, the reticle being in the object field;
using the projection optical unit to project at least a portion of the illuminated portion of the reticle onto a light sensitive material in an image field of the projection optical unit,
wherein the illumination optical unit is an illumination optical unit according to claim 1.

17. The illumination optical unit of claim 1, wherein the first and second sections of the pupil facet mirror are sections of the same pupil facet mirror.

18. The illumination optical unit of claim 1, wherein the first and second sections are mounted separately from each other.

* * * * *

UNITED STATES PATENT AND TRADEMARK OFFICE
CERTIFICATE OF CORRECTION

PATENT NO.         : 9,766,553 B2
APPLICATION NO.    : 14/830985
DATED              : September 19, 2017
INVENTOR(S)        : Manfred Maul Page 1 of 1

It is certified that error appears in the above-identified patent and that said Letters Patent is hereby corrected as shown below:

In the Specification

Column 12, Line 50, delete "an" and insert -- and --.

Signed and Sealed this
Twenty-eighth Day of November, 2017

Joseph Matal
*Performing the Functions and Duties of the*
*Under Secretary of Commerce for Intellectual Property and*
*Director of the United States Patent and Trademark Office*